(12) United States Patent
Miyoshi et al.

(10) Patent No.: US 6,525,328 B1
(45) Date of Patent: Feb. 25, 2003

(54) ELECTRON BEAM LITHOGRAPHY SYSTEM AND PATTERN WRITING METHOD

(75) Inventors: Motosuke Miyoshi, Tokyo-To (JP); Yuichiro Yamazaki, Tokyo-To (JP); Katsuya Okumura, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 132 days.

(21) Appl. No.: 09/624,355

(22) Filed: Jul. 24, 2000

(30) Foreign Application Priority Data

Jul. 23, 1999 (JP) .......................................... 11-209261

(51) Int. Cl.$^7$ ................................................ H01J 37/30
(52) U.S. Cl. ............... 250/492.22; 250/398; 250/396 R
(58) Field of Search ........................ 250/492.22, 492.23, 250/492.2, 396 R, 398

(56) References Cited

U.S. PATENT DOCUMENTS 4,798,959 A * 1/1989 Marks ..................... 250/492.2

FOREIGN PATENT DOCUMENTS

JP 2000-173529 6/2000

OTHER PUBLICATIONS

K. Hattori et al., "Electron–beam direct writing system EX–8D employing character projection exposure method", J. Vac. Sci. Technol. B11(6), pp. 2346–2351, Nov./Dec. 1993.

S. Okayama, "Multipoles; Principles and Their Applications (2)", Electron Microscope, vol. 25, No. 3, pp. 159–166, 1990.

S. Okayama, "Multipoles; Principles and Their Applications (3)", Electron Microscope, vol. 26, No. 1, pp. 58–65, 1991.

Y. Yamazaki et al, "Anamorphotic quadrupole lens system for highly demagnified round spot", Nuclear Instruments & Methods In Physics Research A 363, pp. 67–72, 1995.

H. Sunaoshi et al., "Electron Beam Calibration Method for Character Projection Exposure System EX–8D", Jpn. J. Appl. Phys. vol. 34, pp. 6679–6683, 1995.

Y. Yamazaki et al., "Spot growth of an electron beam with an elliptical cross section due to a space charge effect", Optik, 96, No. 4, pp. 184–186, 1994.

* cited by examiner

Primary Examiner—Kiet T. Nguyen

(57) ABSTRACT

An electron beam lithography system 10 comprises an electron gun including a rectangular cathode 1 having an emission surface having an aspect ratio of other than 1, an illumination optical system 3 of an asymmetric lens system including multipole lenses $Qa_1$ and $Qa_2$, a CP aperture 5, and a projection optical system 8 of a symmetric lens system including multipole lenses $Qb_1$ through $Qb_4$. This electron beam lithography system 10 is used for emitting an electron beam at a low acceleration of 5 kV or less from the rectangular cathode 1, for controlling the illumination optical system so as to form an image of a desired character of the CP aperture 5 on an isotropic plane of incidence at different demagnifications in minor-axis and major-axis directions in accordance with the aspect ratio of the rectangular cathode 1, and for controlling the projection optical system 8 so that the electron beam leaving the CP aperture 5 as an aperture image is incident on a substrate 21 at the same demagnification in the minor-axis and major-axis directions and at different incident angles in the minor-axis and major-axis directions while passing through the trajectory without establishing any crossovers.

22 Claims, 10 Drawing Sheets

ELECTRON BEAM LITHOGRAPHY SYSTEM AND PATTERN WRITING METHOD

BACKGROUND OF THE INVENTION

1. Field of the Invention

The present invention relates generally to a cell projection type electron beam lithography system and a pattern writing method. More specifically, the invention relates to an electron beam lithography system and pattern writing method, which are suitable for pattern writing using a low-energy electron beam.

2. Related Background Art

Electron beam lithography systems for writing patterns on the surface of substrates, such as semiconductor wafers, using an electron beam have particularly excellent resolution, so that the systems are widely noticed as systems meeting the demands that semiconductor circuits be further scaled down.

It is pointed out that electron beam lithography systems, which are put to practical use at present, have disadvantages that (1) the precision of patterns is bad due to the influence of the proximity effect, (2) throughput is low, and so forth.

The proximity effect is a phenomenon that electrons being incident at a high acceleration voltage are scattered in a resist on a wafer, and back-scattered electrons cause the resist around the incident point to be exposed, so that the precision of a pattern deteriorates. In order to correct this, it is required to correct dose in accordance with the layout of the pattern, so that the construction of the system is very complicated.

One of causes for low throughput is that the sensitivity of the resist is low. The reason for this is that the sensitivity of the resist depends on the quantity of secondary electrons produced by the incidence of an electron beam, whereas if an electron beam is incident at a high acceleration voltage, the incident electrons pass through the resist, so that required secondary electrons are not sufficiently produced.

As a technique capable of solving the above described two problems, there is a low acceleration electron beam lithography system. The low acceleration herein indicates an acceleration voltage capable of ignoring the influence of the proximity effect, specifically about 5 kV or less. Because, if the acceleration voltage is low, the energy of incident electrons is low, and the influence of back scattered electrons is small, so that the proximity effect can be reduced. In addition, the energy of incident electrons is low, the scattering cross section in the resist is large, so that the production efficiency of secondary electrons is high. Since low-energy secondary electrons contribute to the sensitizing of the resist, the improvement of the production efficiency of secondary electrons directly appears as the improvement of the sensitivity of the resist. The improvement of the sensitivity of the resist directly appears as the improvement of throughput.

Thus, the low acceleration electron beam lithography system has greater advantages than the high acceleration system, and has remarkable advantages particularly in the field of the direct writing. Moreover, as another advantage obtained by adopting the low acceleration electron beam lithography system, there is an advantage in that an electrostatic column (an electron optical system using an electric-field lens) can be used if the acceleration voltage is low. The electrostatic column has the merits of being easy to be miniaturized, and of having good response characteristics since no hysteresis is caused unlike magnetic-field lenses because an electric-field lens is used therein. However, on the other hand, there is a disadvantage in that the electrostatic column has a high lens voltage when it is used as a focussing lens. For example, when the acceleration voltage is 50 kV, the lens voltage is in the range of from 70 to 100 kV. This is of no practical use. However, if the acceleration voltage is low (5 kV or less), the lens voltage is about 10 kV. This can be put to practical use in the existing high voltage power supply technique. The electrostatic lens has been put to practical use as a deflecting system requiring high speed characteristics, not as a focussing lens. However, electron beam lithography systems where all lenses are constructed of electrostatic lenses have not been put to practical use.

Thus, according to the low acceleration electron beam lithography technique, there is some possibility of realizing a direct writing having high throughput, and there is some possibility of realizing a small lithography system having high controllability by electrostatic columns. It is expected that this is very effective in the formation of a pattern scaled down in future.

However, with respect to the low acceleration electron beam lithography system, there is a problem of the space-charge effect. The space-charge effect is a phenomenon that the flow of charged particles is restricted by the space potential formed by space charges. In the electron beam lithography system, the space-charge effect appears as the restriction of the emission current from a cathode and as the broadening of the beam diameter caused during the convergence of the electron beam including crossovers (so-called beam blurring). Since the space-charge effect depends on the energy of an electron beam, the space-charge effect conspicuously appears when the energy of electron beam is low. Therefore, the space-charge effect causes serious problems in the low acceleration electron beam column.

On the other hand, a cell projection type electron beam lithography system using electrostatic columns has been proposed by H. Sunaoshietal. (Jpn. J. Appl. Phys. Vol. 34 (1995), pp. 6679–6683 (which will be hereinafter referred to as "Background Art 1")). Another cell projection type lithography system is disclosed by K. Hattori et. Al (J. Vac. Scl. Technol. B 11(6), November/December 1993, p2346 (which will be hereinafter referred to as "Background Art 2")).

As shown in Background Art 2, a projection optical system is a double-reduction lens system comprising a reduction lens and an objective lens. The beam blurring caused by the space-charge effect occurs in the projection optical system and on the top surface of the substrate.

With respect to an electrostatic lens, two modes can be selected: one mode is a deceleration mode and the other mode is an acceleration mode. In general, the aberration performance of the acceleration mode is superior to that of the deceleration mode. However, the acceleration mode is of no practical use since the electric field of the lens must be a high electric field. Therefore, the deceleration mode is generally used. In the deceleration mode, after electrons are once decelerated in the lens, the electrons are accelerated again to be emitted from the lens.

An Electron beam establishes a crossover by the reduction lens once to be further decelerated in the objective lens. At this time, the electron beam is greatly affected by the space-charge effect.

Moreover, the surface of the substrate is most remarkably affected by the space-charge effect. In this portion, the beam blurring caused by the space-charge effect depends on the aperture angle and the focal length (the distance where electrons travel in a field-free space). That is, the influence of the space-charge effect increases as the aperture angle decreases, and the influence of the space-charge effect increases as the focal length increases. However, if the aperture angle is increased in order to reduce the influence of the space-charge effect, the influence of aberration increases. In particular, the influence of chromatic aberration increases when operation is carried out at a low acceleration voltage. Therefore, the aperture angle can not be so great. This is a serious problem when an electron optical system for a low acceleration electron beam lithography system is designed.

The influence of the space-charge effect on the surface of a substrate has been analyzed by Y. Yamazaki and M. Miyoshi (Optik 96, No. 4 (1994), pp. 184–186 (which will be hereinafter referred to as "Background Art 3")). This has analyzed the relationship between the increasing ratio of the beam diameter and the aperture angle ratio due to the space-charge effect of an elliptical cross-section beam. More specifically, this has analyzed the influence of the space-charge effect appearing in an optical system when the image of an elliptical cross-section beam having a uniform current density is formed at a circular spot on the surface of a substrate on the anamorphic image-formation optical conditions.

The relationship between the increasing ratio of the beam diameter and the aperture angle due to the space-charge effect is shown in FIG. 1. Since the trajectories in X-axis and Y axis directions are the same in a rotation symmetric system, the aperture angles of incident electrons are the same as each other, so that the aperture angle ratio is 1 ($\alpha/\gamma=1$). The graph of FIG. 1 shows the decreasing rate of the broadening of a beam due to the space-charge effect, which varies in accordance with the increase of the aperture angle ratio, assuming that the broadening of a beam due to the space-charge effect is 1 in the case of a rotation symmetric system, i.e., in the case of $\alpha/\gamma=1$. It can be seen from this graph that the increasing ratio of the beam diameter decreases to reduce the beam blurring as the aperture angle ratio leaves $\alpha/\gamma=\gamma/=1$.

This shows that as the aperture angle ratio increases, the aspect ratio of an elliptical cross-section beam in an equipotential space increases, and the intensity of the electric field acting on electrons at the outermost edge of the beam flux decreases, so that the influence on the beam diameter due to the space-charge effect is suppressed. For example, when the aperture angle ratio is 10, it can be seen that the intensity of the electric field acting the electrons at the outermost edge is smaller by 58% than that in the case of a circular cross-section beam, as shown by broken lines in the figure. In proportion thereto, the increase of the beam diameter is suppressed.

Therefore, it can be seen that it is possible to provide an electron optical lens column capable of remarkably reducing the beam blurring due to the space-charge effect if it is possible to form an optical system, which can form an isotropic CP aperture image on a substrate by means of an elliptical cross-section beam and which can increase the aspect ratio of the elliptical cross-section, i.e., an optical system capable of increasing the incident angle ratio on the surface of a substrate.

It has been described in some papers that a multipole asymmetrical lens system represented by a quadrupole lens is used for forming a probe. Some applied examples of such multipole asymmetrical lens systems are described in Electron Microscope (Vol. 25, No. 3 (1990), pp. 159–166 (which will be hereinafter referred to as "Background Art 4")) and Electron Microscope (Vol. 25, No. 1 (1991), pp. 58–65 (which will be hereinafter referred to as "Background Art 5")). On page 159 of Background Art 4, there is shown a conceptual diagram of an electron optical system of a variable shaped type electron beam lithography system using three-stage electric-field quadrupole lenses. Referring to FIG. 2, the construction of this electron optical system will be described below. Furthermore, in the following figures, the same reference numbers are given to the same elements, and the descriptions thereof are suitably omitted.

The electron optical system of a variable shaped beam system shown in FIG. 2 is an electron optical system for irradiating a rectangular diaphragm 73 with an electron beam, which is emitted from an electron gun 71, by means of an electromagnetic lens (a condenser lens 72) to control the demagnifications in X and Y directions of the rectangular beam which passes through the rectangular diaphragm 73, by means of three-stage quadrupole lenses 74. Octpole lenses 75 are used for correcting astigmatism and deflecting the electron beam. As can be seen from FIG. 2, the electron optical system described in Background Art 4 comprises lenses of a rotation symmetry system in an illumination optical system, from the electron gun to the condenser lens. A projection optical system comprises an asymmetric lens system comprising the quadrupole lens system 74 and the octpole lenses 75.

Since the upper half of the electron optical system, i.e., the illumination system, is the rotation symmetry system, the outgoing angles of the trajectories in the X and Y directions of electrons emitted from the rectangular aperture 73 are equal to each other ($\alpha=\gamma$). Therefore, when the rectangular aperture image is simply reduced and projected, the incident angles on the surface of the substrate are equal to each other. That is, the demagnification in the X-axis directions and the demagnification in the Y-axis directions are equal to each other. Therefore, assuming that the incident angle in the X-axis directions is $\alpha_2$ and that the incident angle in the Y-axis directions is $\gamma_2$, $\alpha_2=\gamma_2$ is obtained.

The electron optical system described in Background Art 4 aims at providing an electron beam lithography system of a variable shaped beam system. Therefore, the electron optical system changes the shape of an irradiation surface on a substrate, which is irradiated with an electron beam, by optionally changing the demagnifications in the X and Y directions with respect to the isotropic rectangular aperture image. When a linear beam is projected, the demagnifications in the X and Y directions are changed. Specifically, as described in Background Art 4, the excitation conditions of an electrodes Q1 through Q3 of the three-stage quadrupole lenses are fixed, and the excitation conditions of the electrodes Q2 and Q3 are changed. Thus, the demagnifications in the X-axis and Y-axis directions are different from each other, so that the incident angles on the surface of the substrate are also different from each other. Therefore, assuming that the incident angle in the X-axis directions is $\alpha'$ and that the incident angle in the Y-axis directions is $\gamma'$, $\alpha' \neq \gamma'$ is obtained.

An image forming optical system based on different incident angles is disclosed by Y. Yamazaki and M. Miyoshi (Nuclear Instruments and Methods In Physics Research A363 (1995), 67–72 (Background Art 6)). In this paper, there is described the image forming conditions of an electric-field quadrupole lens system for reducing and projecting an electron beam from a line cathode (exactly a rectangular cathode) to an isotropic circular beam. The electron optical system shown herein comprises a light source of 10 μm×100 μm, an LaB$_6$ line cathode having an aspect ratio of 10, and an anamorphic image forming system of a three-stage quadrupole lens system (triplet). This electron optical system is designed to deform and reduce the rectangular beam into the circular beam by setting a demagnification of 1/1000 in the X-axis (minor axis) and a demagnification of 1/100 in the Y-axis (major axis).

The ray diagram of the triplet image forming optical system of the quadrupole lens described in Background Art 6 is shown in FIG. 3. The major axis of the rectangular cathode corresponds to X-axis, and the minor axis thereof corresponds to Y-axis. This figure shows two image forming conditions based on the excitation conditions of the quadrupole lens electrode Q2. In order to satisfy the reduction ratio, the strong excitation mode shown by the solid line in the figure is the optimum solution. An X trajectory 81, which is a trajectory in the direction of a major axis, is a convergent trajectory in the quadrupole lens electrode Q1, a divergent trajectory in the quadrupole lens electrode Q2, and finally converges in the quadrupole lens electrode Q3 to form an image on the top surface of a substrate 21. On the other hand, a Y trajectory 82, which is a trajectory in the direction of a minor axis, is a divergent trajectory in the quadrupole lens electrode Q1, a convergent trajectory in the quadrupole lens electrode Q2, and finally forms an image while diverging in the quadrupole lens electrode Q3.

Since the magnificatios on the X and Y axes are different from each other in order to form the image of an electron beam, which is emitted from an asymmetric rectangular cathode, to be an isotropic round beam, the incident angles on the surface of the substrate are different in accordance with the demagnification (p68, FIG. 15). According to this Background Art 6, Mx (demagnification of X-axis trajectory)=1/1000, and My (demagnification of Y-axis trajectory)=1/100, so that the ratio of incident angles is 1:10. Thus, although Background Art 6 discloses the basic concept concerning the construction of the image forming optical system for forming the image of the electron beam, which is emitted from the asymmetric rectangular cathode, to be the isotropic round beam, it does not disclose any concrete means for applying the image forming optical system to a cell projection type electron optical system.

SUMMARY OF THE INVENTION

It is therefore a first object of the present invention to provide a low acceleration electron beam lithography system wherein the influence of the space-charge effect is reduced to provide excellent resolution and throughput.

It is a second object of the present invention to provide a method for writing a pattern at a high resolution and a high throughput while greatly reducing the influence of the space-charge effect using a low acceleration electron beam.

In order to accomplish the aforementioned and other objects, according to one aspect of the present invention, there is provided:

an electron beam lithography system having an electron optical system comprising: an electron beam emitting device for emitting an electron beam to a substrate on which a desired pattern is to be written, the electron beam emitting device having a cathode for emitting electrons, the electron beam having a cross section, which is asymmetric with respect to an optical axis, and, the cathode emitting at an acceleration voltage at which the quantity of back scattered electrons generated from the substrate by irradiation with the electron beam is lower than a quantity at which the light exposure of a close pattern to be written is affected; a character aperture including a hole having a shape corresponding to the shape of the desired pattern; an illumination optical system for controlling the emitted electron beam so as to irradiate the character aperture with the electron beam, the illumination optical system being set with demagnifications which are different in X-axis and Y-axis directions to each other when the direction of the optical axis is Z-axis direction so that the character aperture is irradiated with the electron beam which include a cross section having a first aspect ratio of about 1, the electron beam being shaped so as to correspond to the shape of the shaping aperture, and a projection optical system for demagnifying the electron beam and for forming an image on the substrate, the projection optical system demagnifying the electron beam at the same demagnification in X-axis and Y-axis directions to each other and forming the image on the substrate through a trajectory which is asymmetric with respect to the Z-axis at different incident angles in the X-axis and Y-axis directions to each other.

According to the above described electron beam lithography system, the demagnification which is asymmetric with respect to the optical axis is the in the illumination optical system, so that the electron beam are incident on the shaping aperture at different incident angles in the X and Y directions. At this time, the illumination optical system is generally operated on the image forming condition, i.e., on the condition that the beam trajectories in the X and Y directions intersect each other at one point on the optical axis. In a rotation symmetric optical system, the image forming condition is always established, whereas in an asymmetric optional system, the image forming condition is established when the focal point in the X direction (a point at which the X trajectory intersects Z-axis) is coincident with the focal point in the Y direction (a point at which the Y trajectory intersects Z axis). The illumination optical system originally aims at illuminating the CP aperture, so that it is not always required to form the image according to the present invention. Therefore, the electron beam asymmetrically emitted from the light source is incident on the shaping aperture so as to have an isotropic cross section (an aspect ratio of about 1), so that the electron beam having a cross section (a CP aperture image) corresponding to the shape of the hole of the aperture is emitted from the hole at the same outgoing angle as the incident angle on the shaping aperture. In addition, the projection optical system reduces the electron beam, which is emitted from the hole, at the same demagnification in the X and Y directions, and forms the image on the surface of the substrate at different incident angles in the X and Y directions. Thus, the electron beam is reduced through the trajectory which is asymmetric with respect to the optical axis to form an image isotropically on the surface of the substrate without establishing any crossovers in the illumination optical system and projection optical system. As a result, the influence of the space-charge effect in the projection optical system is removed, so that it is possible to greatly reduce the influence of the space-charge effect on the surface of the substrate. Thus, it is possible to greatly reduce the beam blurring which is caused by conventional low acceleration electron beam lithography systems. As a result, it is possible to provide an electron beam lithography system having excellent resolution and high throughput while using a low-energy electron beam.

In the above described electron beam lithography system, the illumination optical system preferably has a first multipole lens.

Moreover, the illumination optical system preferably has at least two stages of the first multipole lens, and the image forming conditions of the first multipole lens are preferably set so that the first multipole lens serves as an extension system in the X-axis direction and a reduction system in the Y-axis direction in accordance with the first aspect ratio.

The methods for forming the electron beam having the asymmetric cross section include two methods: one is a method for emitting electrons from the rectangular cathode at the same outgoing angle in the X and Y directions, and the other is a method for emitting electrons from the circular cathode at different outgoing angles in the X and Y directions. In either method, the same effect can be obtained by the asymmetric optical system comprising the multipole lens system.

That is, when the rectangular cathode is used, the electrons emitted from the electron beam emitting device at the same outgoing angle in the X and Y directions are incident on the shaping aperture at different incident angles in the X and Y directions.

On the other hand, when the circular cathode is used, the electrons emitted from the electron beam emitting device at different outgoing angles in the X and Y directions are incident on the shaping aperture at optional different incident angles in the X and Y directions through the trajectory which is asymmetric with respect to the optical axis. As a result, the electron beam is incident on the shaping aperture without establishing any crossovers.

The rectangular cathode is preferably formed of lanthanum hexaboride ($LaB_6$), and the circular cathode is preferably a thermal-assisted field emission type cathode.

In the above described electron beam lithography system, the projection optical system preferably has a second multipole lens.

Moreover, the projection optical system preferably has four stages of the second multipole lens, and the image forming conditions of the multipole lens are set so that the electron beam passes through a trajectory which repeats divergence and convergence in the X-axis direction and which repeats convergence and divergence in the Y-axis direction contrary to the X-axis direction.

Thus, the electron beam having a cross section corresponding to the shape of the hole of the aperture is imaged on the surface of the substrate without establishing any crossovers in the projection optical system. As a result, the influence of the space-charge effect in the projection optical system is removed, and the influence of the space-charge effect on the surface of the substrate is greatly reduced, so that it is possible to greatly reduce the beam blurring.

The above described multipole lens may include an electrostatic quadrupole lens or an octpole lens.

According to the second aspect of the invention there is provided:

a pattern writing method for writing a desired pattern on a substrate using an electron beam lithography system comprising an electron optical system which includes an electron gun for emitting an electron beam, a character aperture having a hole having a shape corresponding to the shape of the desired pattern, an illumination optical system for controlling the emitted electron beam so as to irradiate the character aperture with the electron beam, and a projection optical system for controlling the electron beam from the shaping aperture in the shape in accordance with the shape of the hole so as to form an image on the surface of the substrate, the pattern writing method comprising: a first step of emitting the electron beam having a cross section which is asymmetric with respect to an optical axis at an acceleration voltage at which the quantity of back scattered electrons generated from the substrate by irradiation with the electron beam is lower than a quantity at which the light exposure of a close pattern to be written is affected; a second step of setting demagnifications of the illumination optical system to be different in X-axis and Y-axis directions to each other when the direction of the optical axis is Z-axis direction, and of controlling the electron beam so that the electron beam is cast on the character aperture so as to have a substantially isotropic cross section; and a third step of controlling the projection optical system so as to demagnify the electron beam from the character aperture at the same demagnification in X-axis and Y-axis directions and so as to cause the electron beam to pass through a trajectory which is asymmetric with respect to the optical axis and to be cast on the substrate at different incident angles in the X-axis and Y-axis directions to each other to form an image on the substrate.

The second step preferably includes a step of setting focal conditions so that the electron beam is cast on the shaping aperture at different incident angles in the X-axis and Y-axis directions to each other.

Preferably, the step of setting the focal conditions is a step of setting focal conditions in the X-axis and Y-axis directions independently of each other so that the focal point of the electron beam in the X-axis direction is different from the focal point of the electron beam in the Y-axis direction in order to prevent the electron beam from establishing any crossovers. Thus, an optical system, which is asymmetric with respect to the beam axis, is also formed in the illumination optical system, so that it is possible to avoid the crossovers of the electron beam.

The third step preferably includes a step of setting image forming conditions in the projection optical system so that the electron beam passes through a trajectory which repeats divergence and convergence in the X-axis direction and which repeats convergence and divergence in the Y-axis direction contrary to the X-axis direction.

The electron gun preferably has a rectangular cathode having an aspect ratio of a value other than 1 in the X-axis and Y-axis directions, and the first step preferably includes a step of emitting electrons from the rectangular cathode at the same outgoing angle.

Alternatively, the electron gun may have a substantially circular cathode, and the first step may include a step of emitting electrons at different outgoing angles in the X-axis and Y-axis directions to each other. By this step, the same effect can be obtained.

BRIEF DESCRIPTION OF THE DRAWINGS

The present invention will be understood more fully from the detailed description given below and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1:
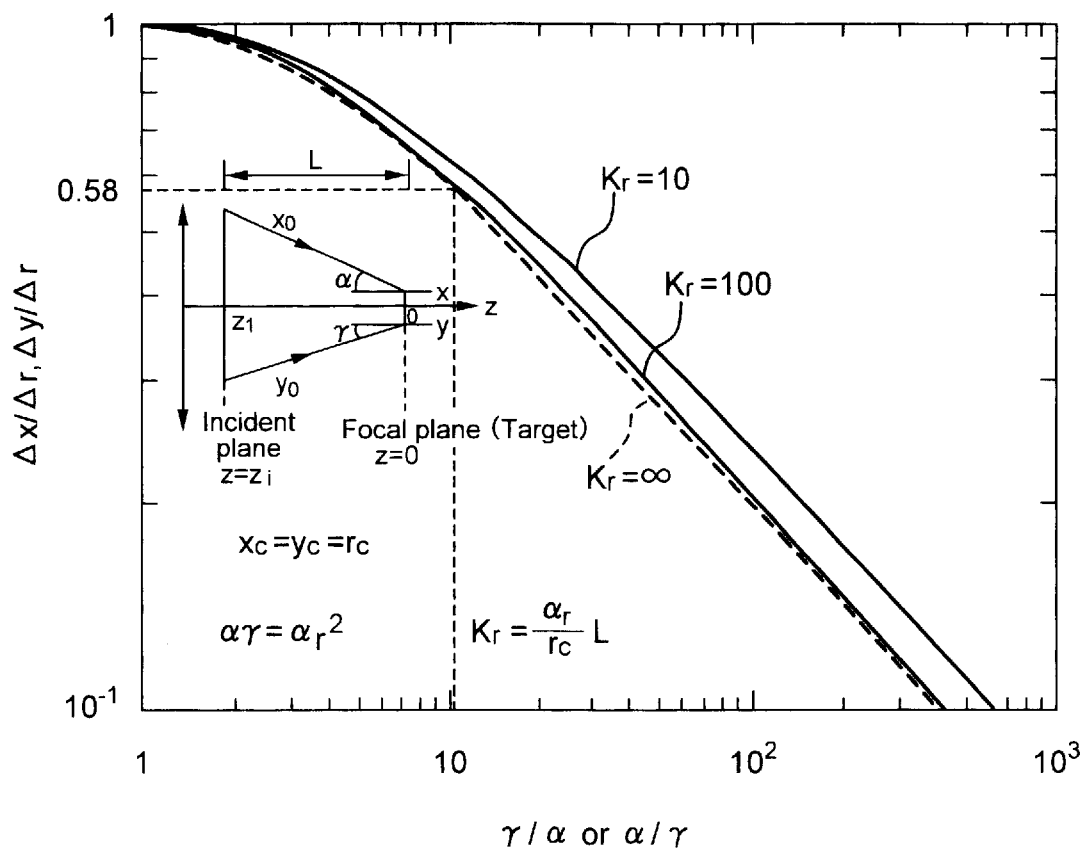
FIG. 1 is a graph showing the relationship between the increasing ratio of a beam diameter and the aperture angle ratio due to the space-charge effect.
Figure 2:
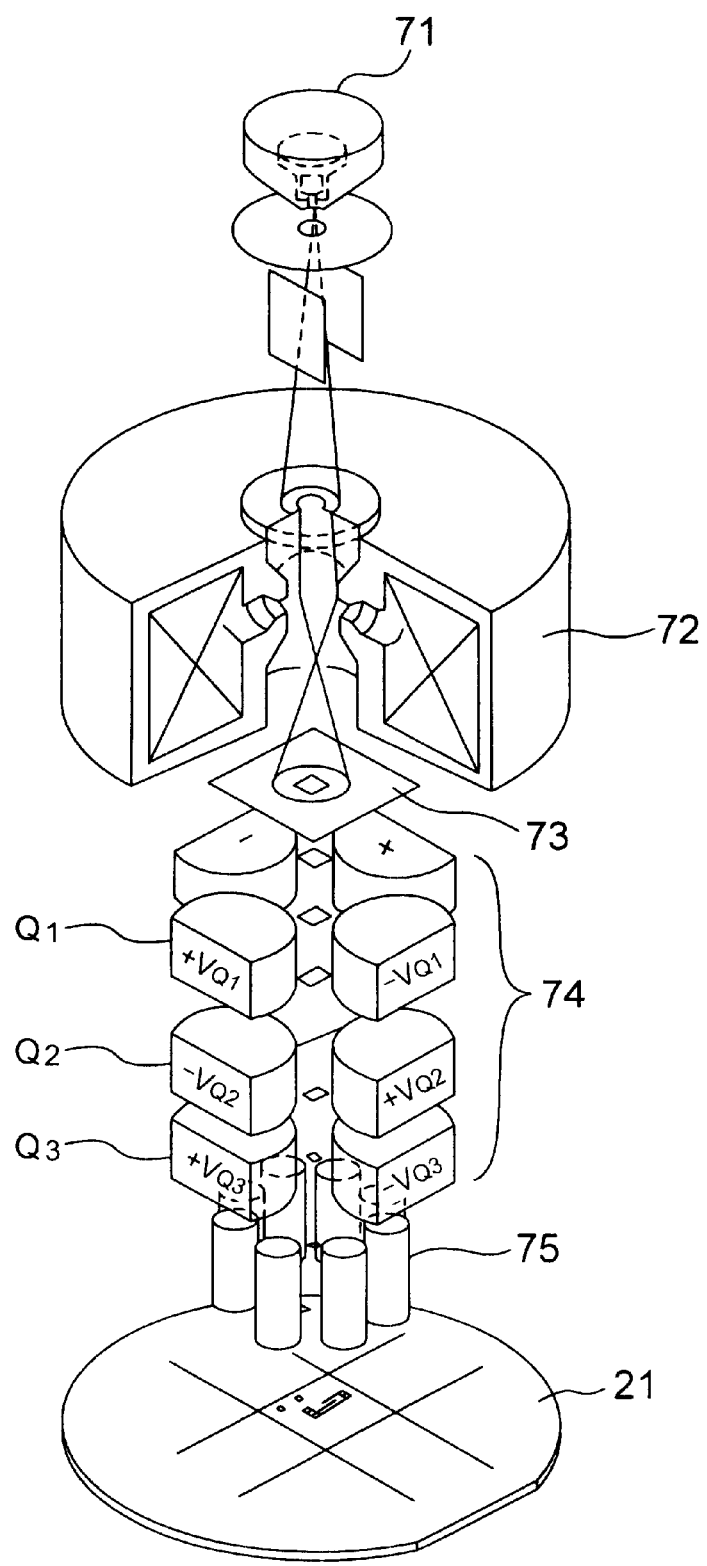
FIG. 2 is a conceptual diagram of an electron optical system of a conventional variable shaped type electron beam lithography system using three-stage electric-field quadrupole lenses.
Figure 3:
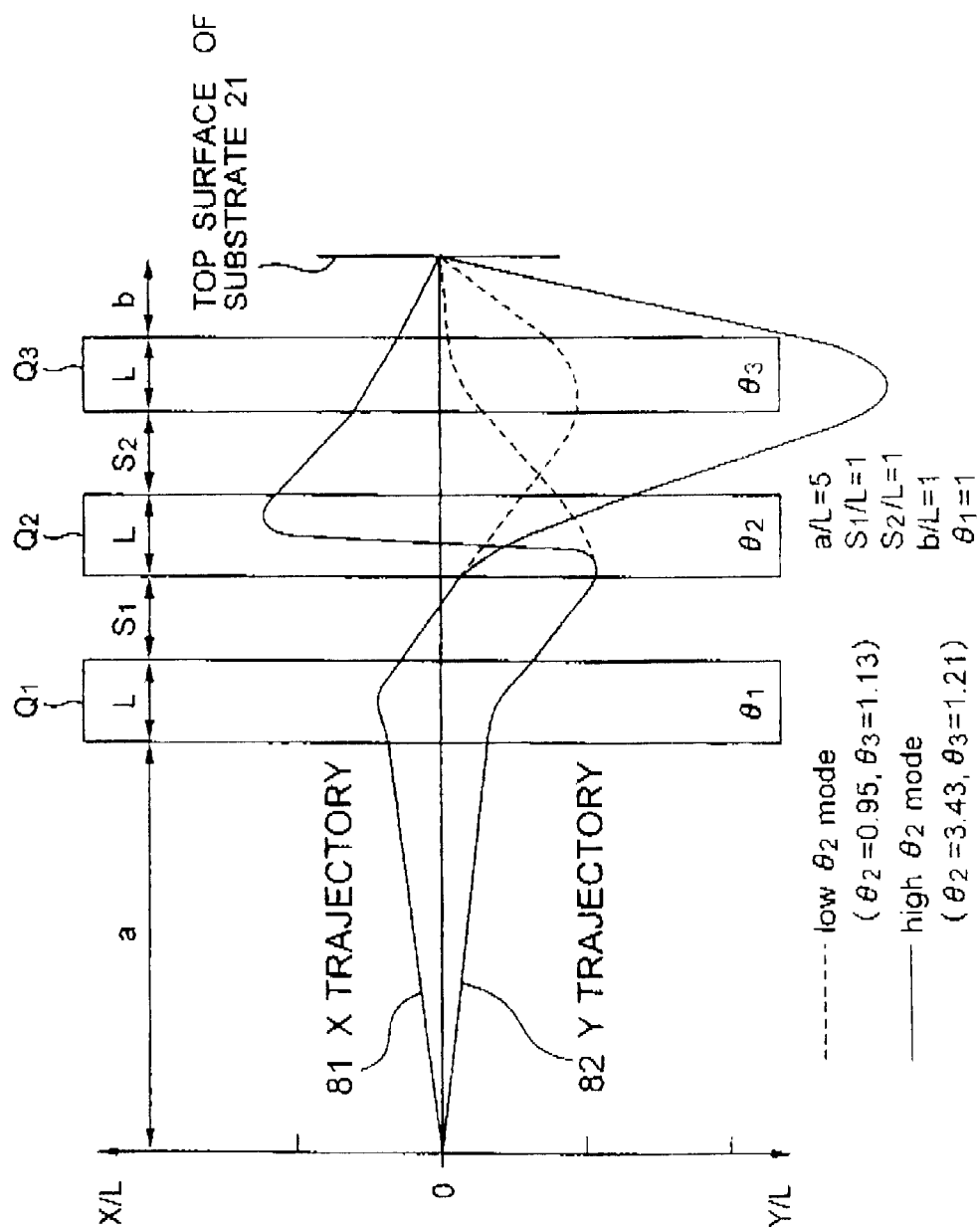
FIG. 3 is a schematic diagram showing a beam trajectory caused by a triplet imaging optical system using quadrupole lenses.
Figure 4:
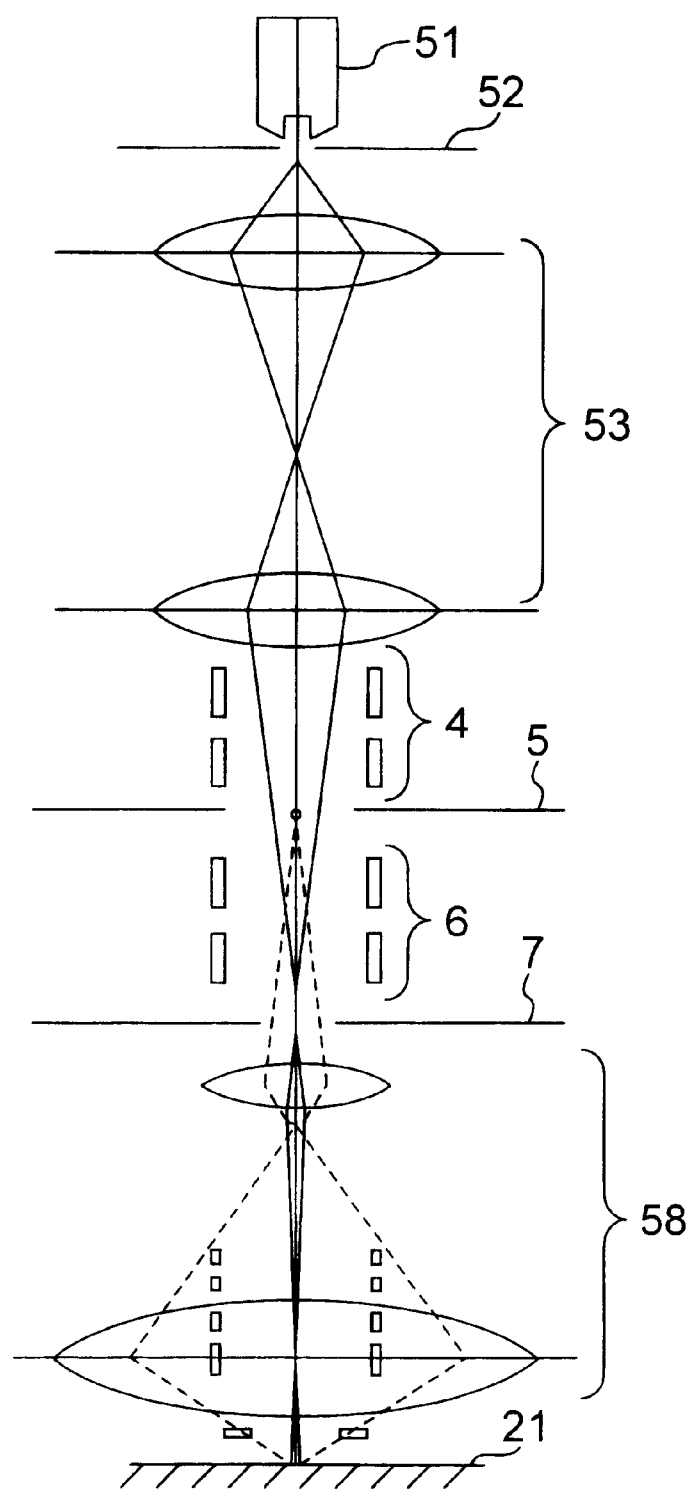
FIG. 4 is a schematic diagram showing the construction of a lens system for explaining an example of a cell projection type column as a premise of an electron beam lithography system according to the present invention.

First, an example of a column of a cell projection type system will be explained with reference to FIG. 4. FIG. 4 is a schematic diagram showing the construction of the lens system. The column shown in FIG. 4 is a premise of an electron beam lithography system according to the invention. The lenses hereinafter include deflecting systems and aberration correcting systems in the broad sense. Furthermore, explanation of beam scanning/deflecting systems and aberration correcting systems, such as an astigmatism correcting system, which have no relation directly to explanation of the present invention, is omitted.

The cell projection type column shown in FIG. 4 mainly comprises an electron gun 51, an illumination optical system 53, a character projection aperture (which will be hereinafter referred to simply as a "CP aperture") 5, and a projection optical system 58. All lenses of the column are constructed with electrostatic lenses. Moreover, the lens for convergent comprises an electrostatic lens of a rotation symmetric system.

An electron beam emitted from the electron gun 51 is shaped by a first aperture angle diaphragm 52 so as to have a rectangular cross section. Then, the trajectory of the electron beam is controlled by the illumination optical system 53, so that the electron beam is enlarged and projected on a CP aperture 5. A first electrostatic shaping/deflecting system 4 selects a character corresponding to a desired pattern to be written from a large number of characters formed on the CP aperture 5, and deflects the beam to cause the selected character to be irradiated with the beam. Assuming that the effective region of the CP aperture 5 is, e.g., 50 $\mu$m, the illumination optical system 53 causes the image formation of the electron beam so that the electron beam covers the region of 50 $\mu$m. A second electrostatic shaping/deflecting system 6 is designed to return the deflected electron beam to the center of the optical axis.

The electron beam, with which the character on the CP aperture 5 is irradiated, is shaped so as to correspond to the shape of the character, and is incident on the projection optical system as a cell pattern beam originating from the CP aperture 5 to be reduced and projected on the top face of a substrate by means of the projection optical system 58. Assuming that the size of a region of the surface of the substrate exposed at a time is 5 $\mu$m square, the reduction ratio is 1/10.

According to the column shown in FIG. 4, an electron beam establishes a crossover by the reduction lens once to be further decelerated in the objective lens. At this time, the electron beam is greatly affected by the space-charge effect.

According to the present invention, the trajectories of an electron beam in X-axis and Y-axis directions are controlled independently of each other to prevent the electron beam, which is emitted from the electron gun, from forming crossover before reaching the substrate, so that the influence of the space-charge effect is greatly reduced.

Referring now to the accompanying drawings, some preferred embodiments of the present invention will be described below.

(1) First Preferred Embodiment

Figure 5:
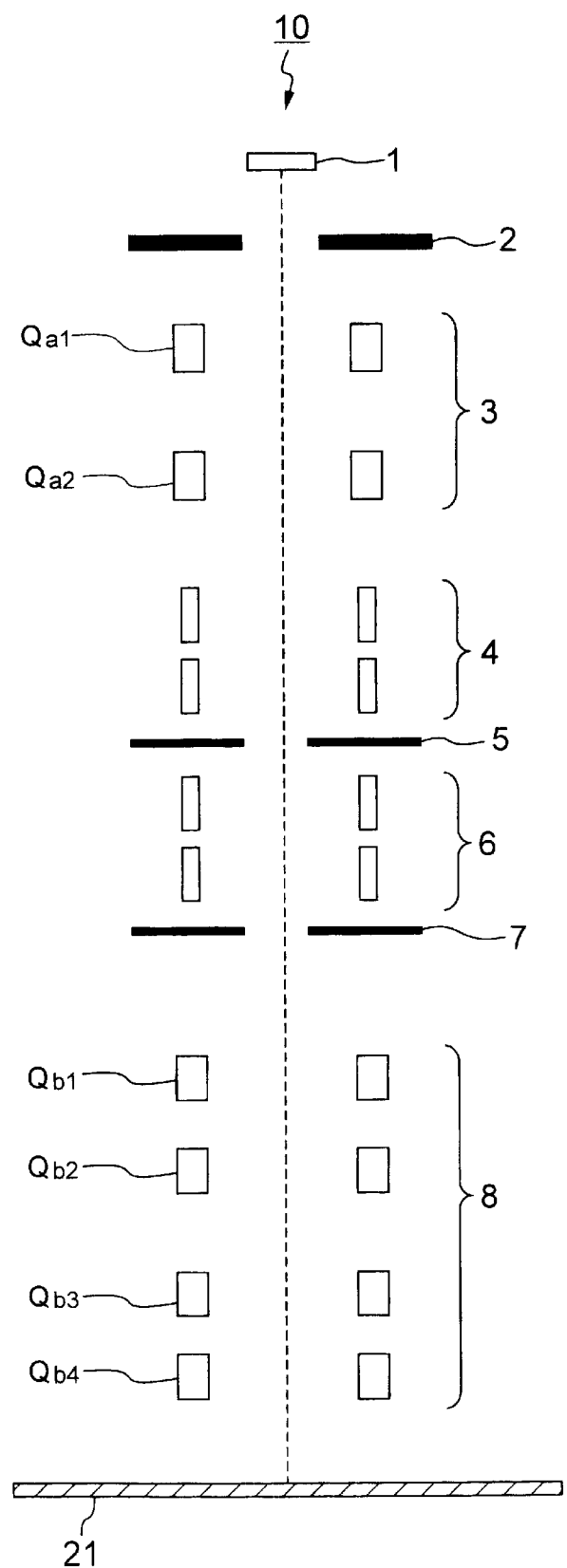
FIG. 5 is a schematic diagram showing the construction of an electron optical system of the first preferred embodiment of an electron beam lithography system according to the present invention.

FIG. 5 is a schematic diagram showing an electron optical system of the first preferred embodiment of an electron beam lithography system according to the present invention. As shown in this figure, a cell projection type electron optical system 10 in this preferred embodiment comprises an electron gun having a cathode 1, a first aperture angle diaphragm 2, an illumination optical system 3, a first shaping/deflecting system 4, a CP aperture (shaping aperture) 5, a second shaping/deflecting system 6, a second aperture angle diaphragm 7, and a projection optical system 8.

The cathode 1 is a rectangular cathode formed of lanthanum hexaboride (LaB$_6$). In this preferred embodiment, the cathode 1 has a short side of 10 $\mu$m, a long side of 100 $\mu$m, and an aspect ratio (first aspect ratio) of 10.

The illumination optical system 3 is a characteristic element in this preferred embodiment, and comprises a two-stage asymmetric lens system (doublet) using quadrupole lenses (first multipole lenses) having electrodes Qa$_1$ and Qa$_2$, respectively. The illumination optical system 3 is designed to irradiate the CP aperture 5 with an electron beam, which is emitted from the cathode 1, at a uniform density to form a CP aperture image. The size of the irradiation region of the CP aperture is usually in the range of from about 50 to 100 $\mu$m square. Furthermore, the first aperture angle diaphragm 2 is designed to define the outgoing angle of electrons from the cathode 1. In addition, the second aperture angle diaphragm 7 is designed to define the incident angles on the projection optical system of the X and Y trajectories. Since it is required to provide a diaphragm for each of the X and Y axes, a pair of X and Y aperture angle diaphragms constitute one diaphragm.

The projection optical system 8 comprises a four-stage asymmetric lens system (quartet) using quadrupole lenses (second multipole lenses), each of which has electrodes Qb$_1$ through Qb$_4$. The projection optical system 8 is designed to reduce an aperture image, which is formed by a character pattern of the CP aperture 5, to project the aperture image to exactly form the image on the top surface of the substrate 21. In this preferred embodiment, the effective exposure region on the top surface of the substrate 21 has a size of 5 $\mu$m, and the reduction ratio of the projection optical system 8 is 1/10.

The reason why the projection optical system 8 uses the four-stage quadrupole lens system is that the reduction ratio and aberration characteristics are simultaneously achieved.

Referring to the accompanying drawings, a method for controlling the electron optical system 10 shown in FIG. 5 will be described as the first preferred embodiment of a pattern writing method according to the present invention.

Figure 6:
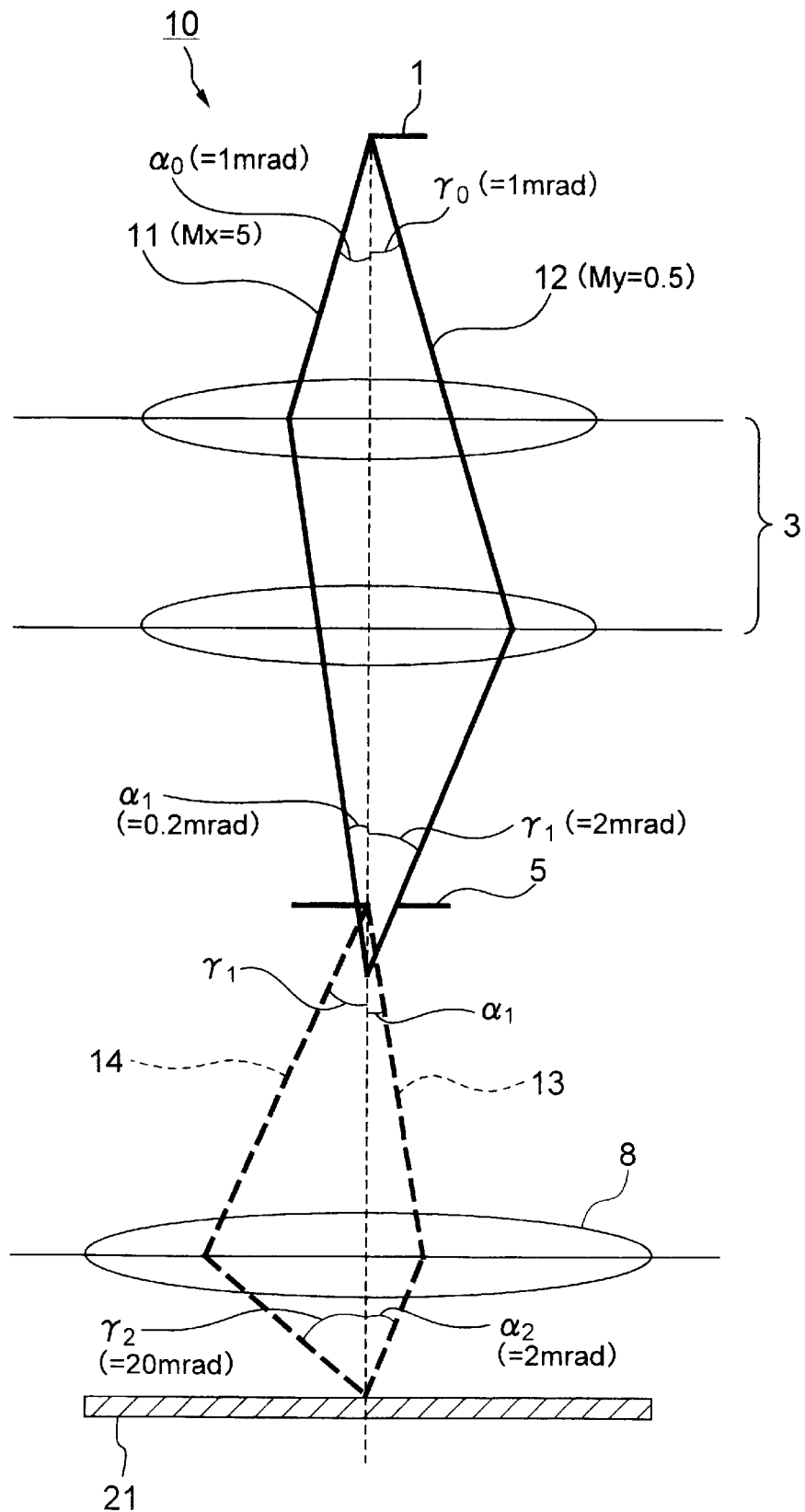
FIG. 6 is a schematic diagram for explaining the beam trajectory of the electron optical system shown in FIG. 5.

FIG. 6 is a schematic diagram showing the beam trajectories of an electron beam controlled by the electron optical system 10 shown in FIG. 5. In FIG. 6, it is assumed that the short side directions of the rectangular cathode 1 are X-axis directions and that the long side directions thereof are Y-axis directions, and there are shown the beam trajectories of an electron beam in X-axis and Y-axis directions. That is, beam trajectories 11 and 12 denote beam trajectories in X and Y directions, respectively, after the electron beam emits from the cathode 1 until the electron beam passes through the CP aperture 5, and beam trajectories 13 and 14 denote beam trajectories in X and Y directions, respectively, in the projection optical system.

The most important feature of the pattern writing method in this preferred embodiment is that the demagnifications of the illumination optical system 3 are set to be asymmetric so that the CP aperture 5 can be irradiated with the electron beam isotropically (in the form of a square or circle). That is, the shape of the electron beam emitting surface of the cathode 1 is set to be rectangular which is asymmetric, and the demagnifications of the illumination optical system 3 in X-axis (minor axis) and Y-axis (major axis) directions on the beam cut surface perpendicular to the optical axis are set to be different from each other, i.e., to be asymmetric, so that the electrons emitted from the cathode 1 at the same outgoing angle are caused to be incident on the CP aperture 5 at different incident angles. This difference in incident angle is determined by simply setting different demagnifications, and each of the demagnifications is determined by the aspect ratio of the cathode 1. For example, if the aspect ratio of the rectangular cathode 1 is 1:10 as this preferred embodiment, the ratio of the demagnifications in the X-axis (minor axis) and Y-axis (major axis) directions is 10, so that the ratio of the incident angles is 1:10.

In this preferred embodiment, the $LaB_6$ cathode 1 having a size of 10 μm×100 μm is used. Therefore, the incident angle $\alpha_1$ on the CP aperture 5 in the X-axis trajectory direction is $\alpha_1=0.2$ mrad, and the incident angle $\gamma_1$ on the CP aperture 5 in the Y-axis trajectory direction is $\gamma_1=2$ mrad. In addition, the incident angle $\alpha_2$ on the top surface of the substrate 21 in the X-axis trajectory direction is $\alpha_2=2$ mrad, and the incident angle $\gamma_2$ on the top surface of the substrate 21 in the Y-axis trajectory direction is $\gamma_2=20$ mrad. A control method for realizing such incident angles with respect to each of optical systems will be described in detail below.

1) Control Method for Illumination Optical System

Figure 7:
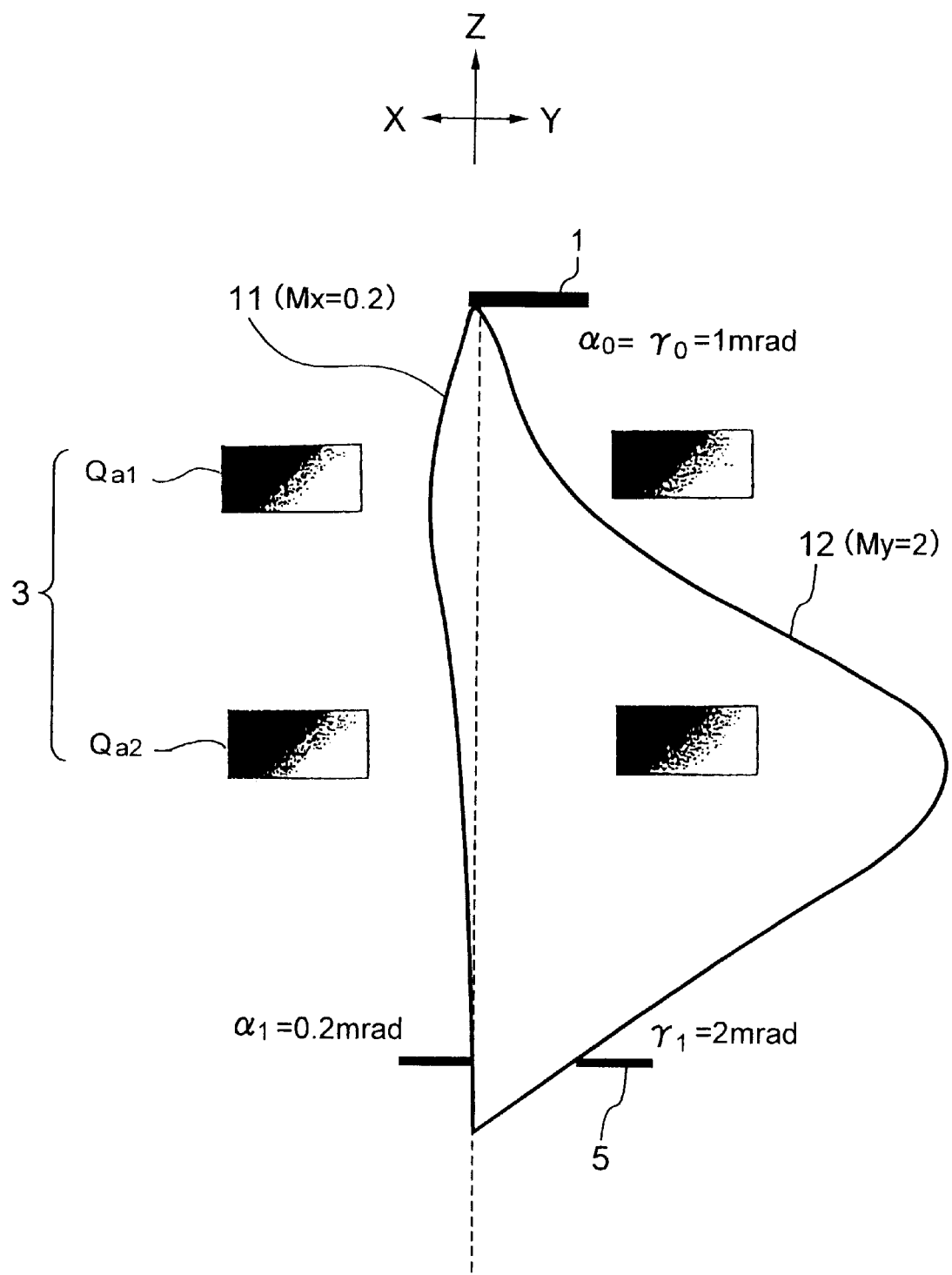
FIG. 7 is a schematic diagram for explaining the schematic construction and beam trajectory of an illumination optical system of the electron optical system shown in FIG. 5.

The concrete construction and beam trajectories of the illumination optical system 3 using the two-stage quadrupole lens system are shown in FIG. 7.

The electron emitting angle from the $LaB_6$ cathode 1 is generally in the range of from 1 mrad to 10 mrad. It is herein set to be 1 mrad. The multipole lens system represented by a quadrupole lens system has the merit of being capable of setting the image formation demagnification separately in the X-axis and Y-axis directions.

In this preferred embodiment, since a pattern is to be written in accordance with a cell projection system, it is required to shape an electron beam so that the CP aperture 5 has a plane of incidence having an isotropic shape of 50 μm square.

In the quadrupole lens system, when one of trajectories of an electron beam in the X-axis and Y-axis direction is a convergent trajectory, the other trajectory is always a divergent trajectory. Therefore, in order to form a convergent optical system using a quadrupole lens system, it is required to provide a construction having two stages or more. The doublet shown herein is the minimum construction. Practically, taking account of the aberration performance and reduction ratio, a construction of more stages is generally used since it is required to avoid the rapid variation in trajectory. However, in the cell projection type illumination optical system, the influence of aberration is not much of a problem. Therefore, the electron beam lithography system 10 shown in FIG. 5 uses the doublet having the minimum construction to realize miniaturization.

Since electrons are emitted from the $LaB_6$ rectangular cathode 1 at the same aperture angle in each of the short side direction (X-axis direction) and long side direction (Y-axis direction), the image forming conditions of extension and reduction systems are set with respect to the X-axis and Y-axis directions, respectively, in order to form a square beam of 50 μm square on the CP aperture 5. In the electron optical system 10 shown in FIG. 5, the length of the short side of the rectangular cathode 1 is 10 μm, and the length of the long side thereof is 100 μm. Therefore, assuming that the demagnification of the X-axis trajectory of the electron beam is Mx and that the demagnification of the Y-axis trajectory thereof is My, Mx=5 and My=0.5.

First, after the X-axis trajectory 11 is caused to converge in the first electrode $Qa_1$, it is caused to diverge in the second electrode $Qa_2$ to form an image on the top surface of the CP aperture 5.

On the other hand, contrary to the X-axis trajectory, after the Y-axis trajectory 12 is caused to diverge in the first electrode Qa1, it is caused to converge in the second electrode Qa2 to form an image on the top surface of the CP aperture 5. At this time, the incident angles on the CP aperture 5 are $\alpha_1=0.2$ mrad and $\gamma_1=2$ mrad which are asymmetric.

2) Control Method for Projection Optical System

Figure 8:
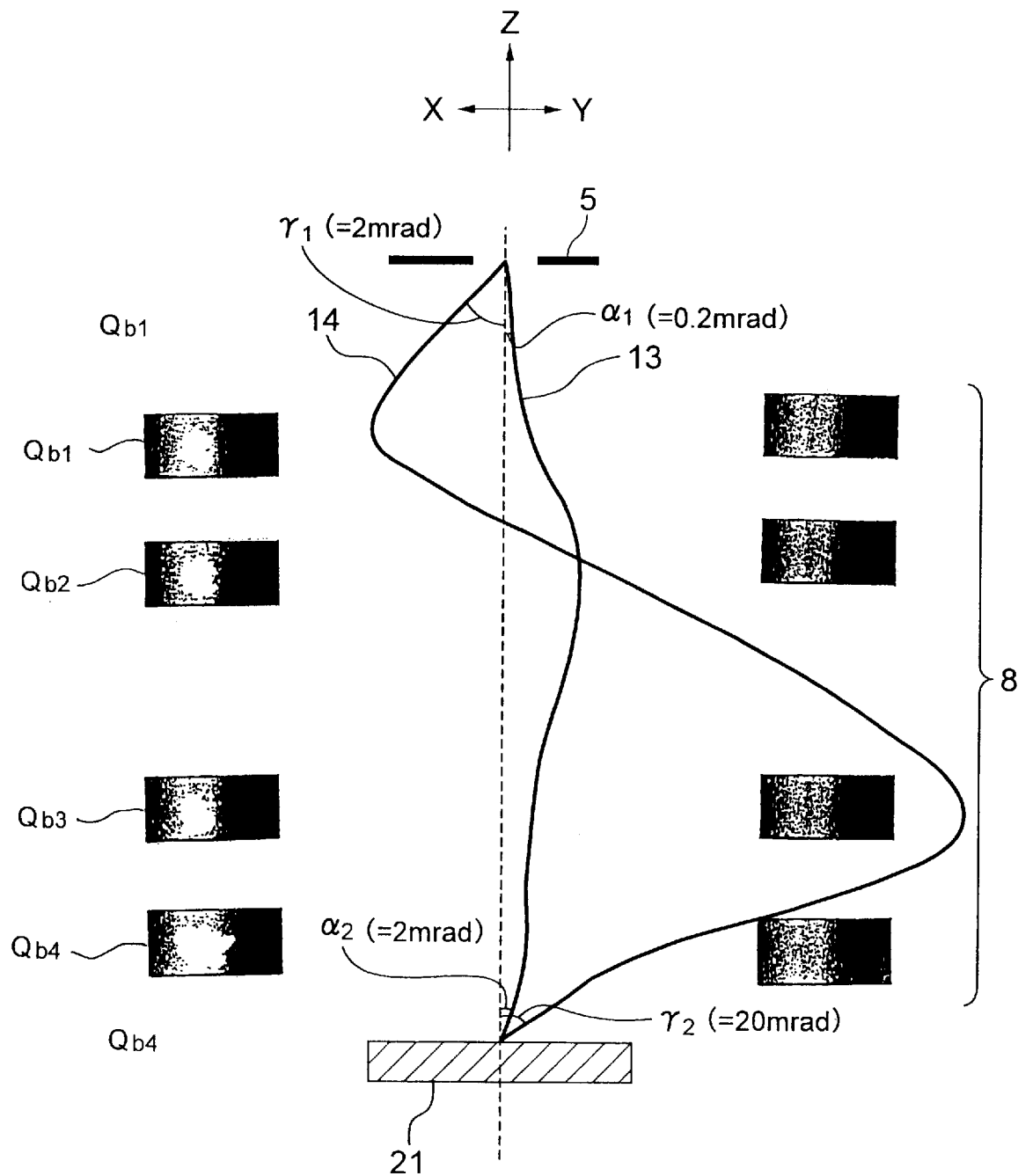
FIG. 8 is a schematic diagram for explaining the schematic construction and beam trajectory of a projection optical system of the electron optical system shown in FIG. 5.

FIG. 8 shows the concrete construction and beam trajectories of the projection optical system 8 using the four-stage quadrupole lens system (quartet). In this preferred embodiment, since the effective region of the CP aperture 5 has a size of 50 μm square, the writing region on the top surface of the substrate 21 is set so as to have a size of 5 μm square. That is, the reduction ratio is 1/10. Since the outgoing angles of the electron beam from the CP aperture 5 serving as a light source of the projection optical system 8 are equal to the above described incident angles, $\alpha_1=0.2$ mrad (minor axis (X-axis) direction), and $\gamma_1=2$ mrad (major axis (Y-axis) direction). In the projection optical system 8, the electron beam is reduced isotropically at reduction ratios of 1/10 in both of X-axis and Y-axis directions to be projected on the top surface of the substrate 21. Therefore, the demagnifications in the X-axis and Y-axis directions are set so as to be equal to each other. That is, Mx=My=1/10.

Also in the projection optical system 8, the CP aperture image is finally formed on the top surface of the substrate 21 while alternately repeating convergence and divergence by means of the quadrupole lens system as described above. After the X-axis trajectory 13 leaves the CP aperture 5 serving as the light source of the projection optical system at an outgoing angle of $\alpha_1=0.2$ mrad, it diverges in the electrode $Qb_1$, converges in the electrode $Qb_2$, diverges in the electrode $Qb_3$ and converges in the electrode $Qb_4$ to form an image on the top surface of the substrate 21. On the other hand, after the Y-axis trajectory 14 leaves the CP aperture 5 at an outgoing angle of $\gamma_1=2$ mrad, it converges in the electrode $Qb_1$, diverges in the electrode $Qb_2$, converges in the electrode $Qb_3$ and diverges in the electrode $Qb_4$ to form an image on the top of the substrate 21.

It should be noted that it can be seen from the X and Y trajectories that the image is formed on the top surface of the substrate 21 without establishing any crossovers in the projection optical system. Accordingly, there occurs almost no beam blurring caused by the space-charge effect due to crossovers in the projection optical system, which has been pointed out as the problem of the related background art.

The demagnifications in the X-axis and Y-axis directions are set to be Mx=My=1/10. Therefore, assuming that the incident angles on the surface of the substrate 21 are $\alpha_2$ and $\gamma_2$, respectively, $\alpha_2=2$ mrad and $\gamma_2=20$ mrad. This corresponds to the fact that the space-charge effect on the surface of the substrate is reduced if the incident angles of the electron beam are asymmetric, as described in the description of the related ground art as a general principle. That is, according to the pattern writing method in this preferred embodiment, since the ratio of the incident angles in the X-axis and Y-axis directions is 1:10, the beam blurring caused by the space-charge effect is expressed by the following formula, so that the influence on the space resolution is reduced to 1/1.8.

$$\Delta x/\Delta\alpha = \Delta y/\Delta\gamma = 2/[(\alpha/\gamma)^{1/2} + (\gamma/\alpha)^{1/2}]$$

In this preferred embodiment, the aspect ratio of the $LaB_6$ rectangular cathode has been set to be 1:10 to obtain the above described results. However, since an aspect ratio of 1:100 can be already obtained in the manufacturing technology, the influence of the space-charge effect can be reduced to about 1/10 by further one order if such a rectangular cathode is used.

Thus, according to this preferred embodiment, it is possible to establish the relationship between the aperture angle of the electron beam and the space-charge effect on the image forming cross-section, which is the known principle (Background Art 3), so that it is possible to provide a pattern writing method capable of greatly reducing the influence of the space-charge effect using a low acceleration cell projection type electron beam lithography system.

(2) Second Preferred Embodiment

While the rectangular light source has been used in the above described first preferred embodiment, the above described object of the present invention can be accomplished even if a widely used circular light source is used.

Figure 9:
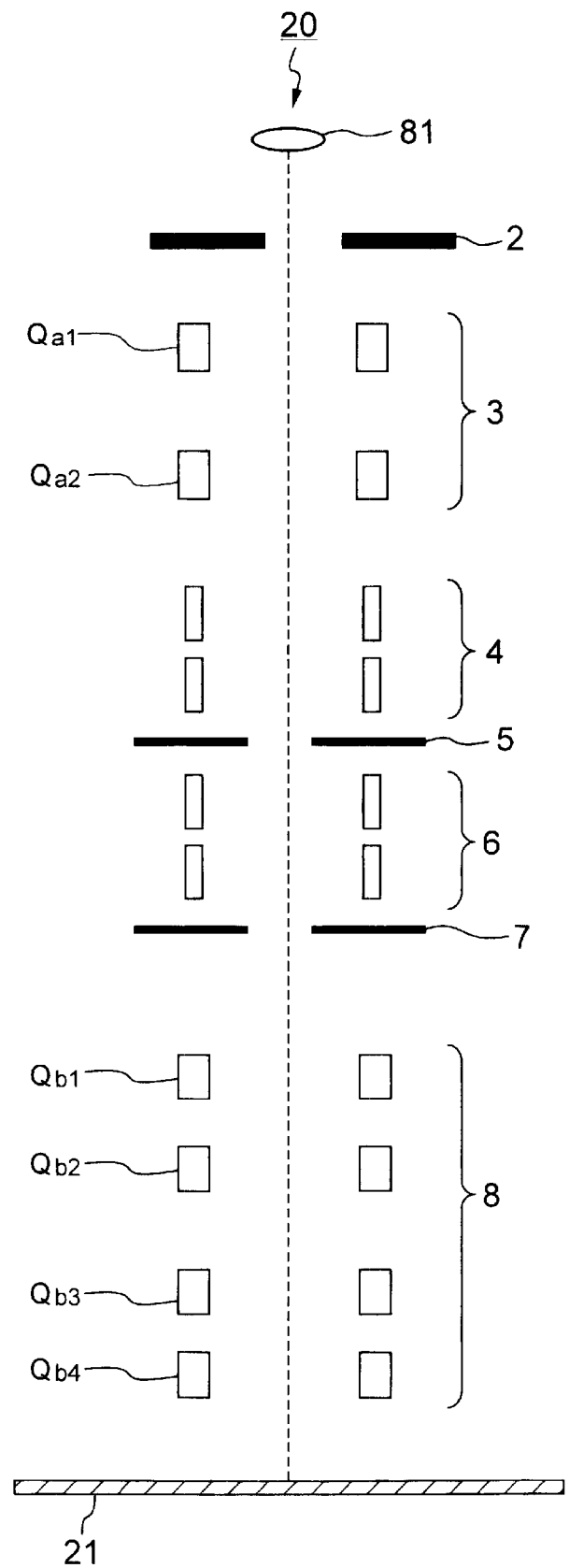
FIG. 9 is a schematic diagram showing the construction of an electron optical system of the second preferred embodiment of an electron beam lithography system according to the present invention.

FIG. 9 is a schematic diagram showing the construction of an electron optical system of the second preferred embodiment of an electron beam lithography system according to the present invention. As shown in this figure, a cell projection type electron optical system 20 in this preferred embodiment comprises an electron gun having a circular cathode 81. The circular cathode 81 is formed of ZrO/W having a size of about 1 $\mu$m (a sphere of 1 $\mu$m $\phi$ at the apex of tip). The electron gun in this preferred embodiment is a thermal-assisted field emission (TFE) type electron gun. Since the thermal-assisted field emission type electron gun has a high brightness and a small energy spread of 1 eV, it has the merit of being capable of reducing the influence of chromatic aberration. The constructions other than the electron gun of the electron optical system 20 shown in FIG. 9 are substantially the same as those of the electron optical system 10 shown in FIG. 5. Therefore, a two-stage quadrupole lens system 3 having the minimum construction is adopted.

Referring to the accompanying drawings, a control method for the electron optical system 20 shown in FIG. 9 will be described as the second preferred embodiment of a pattern writing method according to the present invention.

Since the operation conditions of the projection optical system of the electron optical system 20 are substantially the same as those in the above described first preferred embodiment, the descriptions thereof are omitted, and a control method for an illumination optical system will be described below. The feature of the control method in this preferred embodiment is that an asymmetric optical system is formed by separately setting the focal points of X-axis and Y-axis trajectories.

Figure 10:
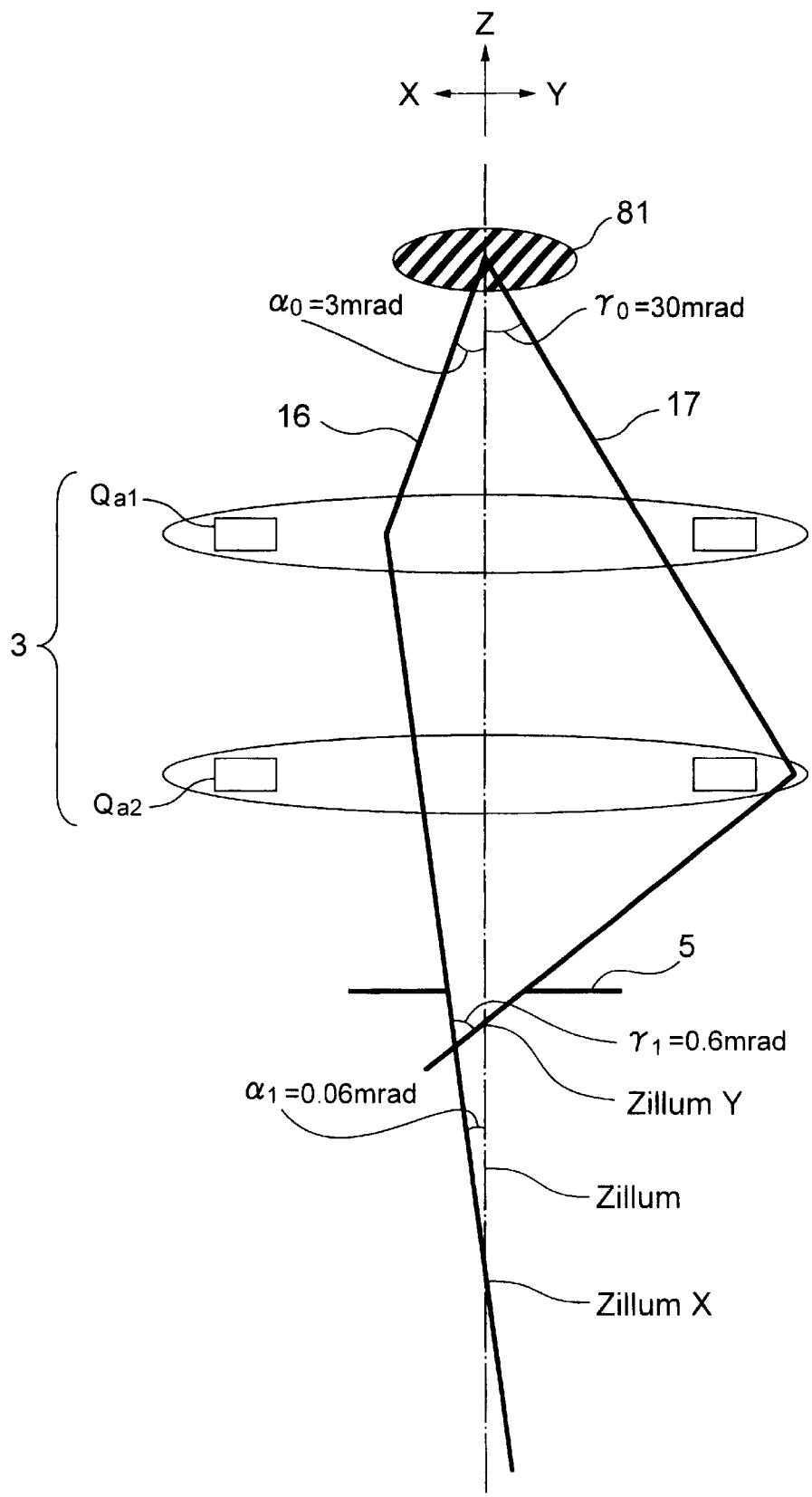
FIG. 10 is a schematic diagram for explaining the construction and beam trajectory of an illumination optical system of the electron optical system shown in FIG. 9.

FIG. 10 is a schematic diagram for explaining the construction and beam trajectories of the illumination optical system of the electron optical system 20 shown in FIG. 9. In FIG. 10 similar to FIG. 7, when the beam axis of an electron beam extends along Z-axis, and the beam trajectories of the electron beam are shown in X-axis and Y-axis directions, respectively. That is, beam trajectories 16 and 17 are beam trajectories in X and Y directions, respectively, after the electron beam emits from the circular cathode 81 until the electron beam passes through the CP aperture 5.

First, by appropriately arranging a first aperture angle diaphragm 2 (see FIG. 9), the aperture angle $\alpha_0$ of the electron beam in the X-axis directions and the aperture angle $\gamma_0$ of the electron beam in the Y-axis directions are set to be different values from each other. In this preferred embodiment, since the TFE cathode has a size of about 1 $\mu$m, the emission systems of the electron beam in the X-axis and Y-axis directions are divergence systems in order to illuminate the CP aperture of 50 $\mu$m.

In the emission angle distribution of the ZrO/W cathode of a typical TFE electron gun, the emission angle capable of obtaining stable emission electrons is 30 mrad at the maximum. Therefore, in this preferred embodiment, $\gamma_0=30$ mrad and $\alpha_0=3$ mrad are set to obtain outgoing electrons having an aspect ratio of 10. Moreover, since the demagnification of the illumination optical system must be about 50, the aperture angle $\alpha_1$ (X-axis direction) at the focal point is about 0.006 mrad, and the aperture angle $\gamma_1$ (Y-axis direction) at the focal point is about 0.6 mrad. However, in this preferred embodiment as shown in FIG. 10, no image is formed on the trajectories in the X-axis and Y-axis directions, and the focal points are shifted from each other. Consequently, the demagnification values in the X-axis and Y-axis directions are different values near about 50 from each other. Such a setting is used for optimizing the illumination optical system between the illumination optical system and the subsequent image forming optical system. Therefore, such a setting is a mere design feature, not an essential feature.

FIG. 10 shows a focal length $X_{illumX}$ on the trajectory in the X-axis directions, and a focal length $Y_{illumY}$ on the trajectory in the Y-axis directions. FIG. 10 also shows an image formed position $Z_{illum}$ if the image of an electron beam is otherwise formed immediately after passing through the CP aperture 5 in accordance with the background art. According to the control method for the illumination optical system in this preferred embodiment, an optical system, which is asymmetric with respect to the optical axis, is formed, so that these focal lengths $X_{illumX}$ and $Y_{illumY}$ can be independently set. That is, $X_{illumX}$ and $Y_{illumY}$ are set so as to be shifted vertically in the Z-axis directions on both sides of $Z_{illum}$. Therefore, according to the pattern writing method in this preferred embodiment, the electron beam is incident on the projection optical system without being imaged, no cross over is formed from the light source to a wafer. As a result, the concentration of electrons due to crossover is further inhibited, so that it is possible to further reduce the influence of the space-charge effect.

In order to reduce the influence of the space-charge effect, the aspect ratio of the electron beam in the cross section is preferably greater. The aspect ratio of the rectangular cathode is also 100 or higher at present. On the other hand, in the case of the TFE, the emission angle capable of obtaining stable emission electrons is 30 mrad at the maximum as described above. Therefore, as compared with the case where the rectangular cathode is used, there is a limit to improvement in the case of a circular cathode. However, by using the control method in this preferred embodiment, it is possible to write a pattern at a high resolution and a high throughput while greatly reducing the influence of the space-charge effect.

While the present invention has been disclosed in terms of the preferred embodiment in order to facilitate better understanding thereof, it should be appreciated that the invention can be embodied in various ways without departing from the principle of the invention.

For example, while the above descried electron beam lithography system in the second preferred embodiment has had the ZrO/W thermal-assisted field emission type cathode, the same effect can be obtained even if any one of other W cold cathodes and carbide cathodes and so forth is used.

In addition, the objects of the present invention can be accomplished if the lens systems of the illumination optical system and projection optical system are asymmetric lens systems capable of independently setting the convergence characteristics of the X-axis and Y-axis, particularly the demagnifications thereof. Therefore, it is not required to form the lens systems of only the electrostatic quadrupole lens systems as in the above described preferred embodiments, and the objects of the present invention can be accomplished if only multipole lenses (octpole lenses or more multipole lenses) are used. In addition, while the multipole lenses have been arranged in two stages in the illumination optical system and in four stages in the projection optical system, it is possible to improve the aberration performance using more stages of multipole lenses. Moreover, part or all of the electrostatic multipole lenses can be replaced with magnetic-field multipole lenses. This is a problem of trade-off in design between the shape (size) and weight of a column, and a required specification.

As mentioned above, the invention should be understood to include all possible embodiments and modification to the shown embodiments which can be embodied without departing from the principle of the invention as set forth in the appended claims.

What is claimed is:

1. An electron beam lithography system having an electron optical system comprising:
    an electron beam emitting device for emitting an electron beam to a substrate on which a desired pattern is to be written,
        said electron beam emitting device having a cathode for emitting electrons,
        said electron beam having a cross section, which is asymmetric with respect to an optical axis, and,
        said cathode emitting at an acceleration voltage at which the quantity of back scattered electrons generated from said substrate by irradiation with said electron beam is lower than a quantity at which the light exposure of a close pattern to be written is affected;
    a character aperture including a hole having a shape corresponding to the shape of said desired pattern;
    an illumination optical system for controlling the emitted electron beam so as to irradiate said character aperture with the electron beam, said illumination optical system being set with demagnifications which are different in X-axis and Y-axis directions to each other when the direction of said optical axis is Z-axis direction so that said character aperture is irradiated with said electron beam which includes a cross section having a first aspect ratio of about 1, said electron beam being shaped so as to correspond to the shape of said shaping aperture, and
    a projection optical system for demagnifying said electron beam and for forming an image on said substrate,
        said projection optical system demagnifying said electron beam at the same demagnification in X-axis and Y-axis directions to each other and forming the image on said substrate through a trajectory which is asymmetric with respect to said Z-axis at different incident angles in said X-axis and Y-axis directions to each other.

2. An electron beam lithography system as set forth in claim 1, wherein said illumination optical system has a first multipole lens.

3. An electron beam lithography system as set forth in claim 2, wherein said cathode is a rectangular cathode having a second aspect ratio of a value other than 1 in said X-axis and Y-axis directions, and said electron beam emitting device emits electrons at the same outgoing angle.

4. An electron beam lithography system as set forth in claim 3, wherein said illumination optical system has at least two stages of said first multipole lens, and the focal conditions of said first multipole lens are set so that said first multipole lens serves as an extension system in said X-axis direction and a reduction system in said Y-axis direction in accordance with said second aspect ratio.

5. An electron beam lithography system as set forth in claim 4, wherein said projection optical system has a second multipole lens.

6. An electron beam lithography system as set forth in claim 5, wherein said projection optical system has four stages of said second multipole lens, and the image forming conditions of said second multipole lens are set so that said electron beam passes through a trajectory which repeats divergence and convergence in said X-axis direction and which repeats convergence and divergence in said Y-axis direction contrary to said X-axis direction.

7. An electron beam lithography system as set forth in claim 6, wherein said cathode is formed of lanthanum hexaboride ($LaB_6$).

8. An electron beam lithography system as set forth in claim 6, wherein the focal conditions of said illumination optical system are set so that said electron beam is incident on said character aperture at different incident angles in said X-axis and Y-axis directions.

9. An electron beam lithography system as set forth in claim 8, wherein said focal conditions in said X-axis and Y-axis directions are set independently of each other so that the focal point of said electron beam in said X-axis direction is different from the focal point of said electron beam in said Y-axis direction in order to prevent said electron beam from establishing any crossovers.

10. An electron beam lithography system as set forth in claim 9, wherein said projection optical system has a second multipole lens.

11. An electron beam lithography system as set forth in claim 10, wherein said projection optical system has four stages of said second multipole lenses, and the focal conditions of said second multipole lenses are set so that said electron beam passes a trajectory which repeats divergence and convergence in said X-axis direction and which repeats convergence and divergence in said Y-axis direction contrary to said X-axis direction.

12. An electron beam lithography system as set forth in claim 11, wherein said multipole lens includes an electrostatic quadrupole lens.

13. An electron beam lithography system as set forth in claim 11, wherein said multipole lens includes an octpole lens.

14. An electron beam lithography system as set forth in claim 5, wherein said multipole lens includes an electrostatic quadrupole lens.

15. An electron beam lithography system as set forth in claim 14, wherein said multipole lens includes an octpole lens.

16. An electron beam lithography system as set forth in claim 2, wherein said cathode has a substantially circular shape, and said electron beam emitting device emits said electron beam on the basis of electrons emitted at different outgoing angles in said X-axis and Y-axis directions.

17. A pattern writing method for writing a desired pattern on a substrate using an electron beam lithography system comprising an electron optical system which includes an electron gun for emitting an electron beam, a character aperture having a hole having a shape corresponding to the shape of said desired pattern, an illumination optical system for controlling the emitted electron beam so as to irradiate said character aperture with the electron beam, and a projection optical system for controlling said electron beam from said shaping aperture in the shape in accordance with the shape of said hole so as to form an image on the surface of said substrate, said pattern writing method comprising:

- a first step of emitting said electron beam having a cross section which is asymmetric with respect to an optical axis at an acceleration voltage at which the quantity of back scattered electrons generated from said substrate by irradiation with said electron beam is lower than a quantity at which the light exposure of a close pattern to be written is affected;
- a second step of setting demagnifications of said illumination optical system to be different in X-axis and Y-axis directions to each other when the direction of said optical axis is Z-axis direction, and of controlling said electron beam so that said electron beam is cast on said character aperture so as to have a substantially isotropic cross section; and
- a third step of controlling said projection optical system so as to demagnify said electron beam from said character aperture at the same demagnification in X-axis and Y-axis directions and so as to cause said electron beam to pass through a trajectory which is asymmetric with respect to said optical axis and to be cast on said substrate at different incident angles in said X-axis and Y-axis directions to each other to form an image on said substrate.

18. A pattern writing method as set forth in claim 17, wherein said second step includes a step of setting focal conditions so that said electron beam is incident on said shaping aperture at different incident angles in said X-axis and Y-axis directions to each other.

19. A pattern writing method as set forth in claim 18, wherein said step of setting said focal conditions is a step of setting focal conditions in said X-axis and Y-axis directions independently of each other so that the focal point of said electron beam in said X-axis direction is different from the focal point of said electron beam in said Y-axis direction in order to prevent said electron beam from establishing any crossovers.

20. A pattern writing method as set forth in claim 19, wherein said third step includes a step of setting image forming conditions in said projection optical system so that said electron beam passes through a trajectory which repeats divergence and convergence in said X-axis direction and which repeats convergence and divergence in said Y-axis direction contrary to said X-axis direction.

21. A pattern writing method as set forth in claim 20, wherein said electron gun has a rectangular cathode having an aspect ratio of a value other than 1 in said X-axis and Y-axis directions, and said first step includes a step of emitting electrons from said rectangular cathode at the same outgoing angle.

22. A pattern writing method as set forth in claim 20, wherein said electron gun has a substantially circular cathode, and said first step includes a step of emitting electrons at different outgoing angles in said X-axis and Y-axis directions.

* * * * *